United States Patent [19]
Matsuzaki et al.

[11] Patent Number: 5,835,352
[45] Date of Patent: Nov. 10, 1998

[54] POWER AMPLIFYING MODULE

[75] Inventors: Ken-ichiro Matsuzaki; Gaku Ishii; Kenji Otobe; Tatsuya Hashinaga, all of Yokohama, Japan

[73] Assignee: Sumitomo Electric Industries, Ltd., Osaka, Japan

[21] Appl. No.: 669,002

[22] Filed: Jun. 21, 1996

[30] Foreign Application Priority Data

Jun. 22, 1995 [JP] Japan ................................ 7-156126

[51] Int. Cl.⁶ ........................................ H05K 7/20
[52] U.S. Cl. .................. 361/707; 165/80.2; 165/185; 174/16.3; 257/707; 257/713; 361/715; 361/717
[58] Field of Search ................... 165/80.2, 80.3, 165/185; 174/16.3; 257/706–707, 712–713, 718–719; 361/704, 707, 716–722, 761, 763–764, 774, 776, 812

[56] References Cited

U.S. PATENT DOCUMENTS 4,135,168  1/1979  Wade ................................. 331/108 R
4,227,036  10/1980 Fitzgerald ............................. 174/16
5,041,943  8/1991  Ilardi et al. ............................ 361/707
5,311,402  5/1994  Kobayashi et al. .................... 361/707
5,398,160  3/1995  Umeda .................................. 361/707

FOREIGN PATENT DOCUMENTS 59-143406  8/1984  Japan .

Primary Examiner—Gregory D. Thompson
Attorney, Agent, or Firm—Pillsbury Madison & Sutro LLP

[57] ABSTRACT

A power amplifying module has a package formed by welding a package bottom plate being a package substrate of a generally flat plate shape with a cap being a metal package cap of a generally rectangular box shape. A wiring substrate of a generally flat plate shape is placed on the package bottom plate and this wiring substrate is covered by the cap. There are two through holes formed in the wiring substrate and two heat spreaders of a generally flat plate shape are positioned in portions exposed through the through holes on the package bottom plate. Semiconductor devices sealed with a resin or the like are set by soldering or the like on respective surfaces of these heat spreaders.

6 Claims, 7 Drawing Sheets

POWER AMPLIFYING MODULE

BACKGROUND OF THE INVENTION

1. Field of the Invention

The present invention relates to a pow amplifying module, more particularly, to a power amplifying module containing a wiring substrate and a semiconductor device electrically connected to a power amplifying circuit on the substrate, which are housed in a package.

2. Related Background Art

With increasing demand to make electronic apparatus, more compact and functional electronic components contained in the electronic apparatus are being made smaller and more functional. For example, the electronic components circuit substrate is formed, in which very small active and passive circuit elements such as microchips are wired on an insulating substrate, and the moduled electric components containing the electronic circuit substrate, for example a power amplifying module, are frequently used.

A conventional example of such module will be explained in FIGS. 10A and 10B. As shown in the exploded perspective view of FIG. 10A, the module is constructed by connecting active elements 1 such as transistors and passive elements 2 such as chip resistors or chip capacitors to conducting patterns (not shown) formed on an insulating substrate 80. Further, a plurality of metal lead pins 83a–83d are fixed to a side end of the insulating substrate 80.

The shape of the lead pin 83a will be explained. The lead pin 80 is composed of a hooking portion 84 for pinching the side end of the insulating substrate 80 and a leg portion 85 which is bent downward are integrally formed. The hooking portion 84 is electrically connected to a predetermined portion of the conducting pattern. The reason why the leg portion 85 is bent downward is that when the module is mounted on a substrate for example, a printed circuit board a, clearance is necessary in order to avoid the short circuit between the hooking portion and the substrate.

Further, a package bottom plate 3 is attached to the bottom surface of the insulating substrate 80 as shown in FIG. 10B. This bottom plate 3 is bent at both ends to form steps 4 and 5 having a predetermined height. The predetermined height of the steps is the same as the legs 85 of the lead pins 83a–83d. Therefore, when the module is mounted on the printed circuit board, each leg 85 of the lead pins 83a–83d and the steps 4 and 5 are kept at the same height. Next a box-shaped cap 6 is fitted onto the insulating substrate 80 and finally the moduled electronic component is formed.

However, the following problem often occurs.

Since the package bottom plate 3 is formed by bending (steps 4 and 5) the package bottom plate 3 with an uniform height cannot be always fabricated.

Namely, play between the package bottom plate and a printed circuit board appears when placed on the printed circuit board due to the unbalanced heights between them. This causes a poor contact between the lead pins and the printed circuit board. When mechanical stress is forced to make a contact between them and they are fixed to each other by soldering, it causes deformation of lead pins by applying undesired mechanical stress to the lead pins and, as the result, it causes degradation of electrical characteristic.

When a heat radiating plate (not shown) is inserted between the package bottom plate 3 and the printed circuit board to improve the heat radiating effect, contact between the radiating plate and the printed circuit board are degraded due to the above play and, as the result, sufficient heat radiation effect cannot be realized.

As long as the suppression of the degradation of the high frequency characteristics, a bare chip type semiconductor device is superior to the package type semiconductor device. However on the other hand, the package type semiconductor device is easy to handle and is preferable in the productivity thereof. Moreover, the package type semiconductor is preferable in the reliability in resistivity to humidity.

Therefore, generally a mold-sealded semiconductor device in view of the reliability and the productivity, is employed, but in such a device, it is not easy to obtain the good heat radiation and to keep the good high frequency characteristics.

SUMMARY OF THE INVENTION

The conventional power amplifying modules as described above generate a lot of heat due to their high power characteristics. While the insulating substrate usually has a rather small thermal conductivity because it is made of alumina, a glass epoxy resin, or the like. It cannot radiate the heat generated in the transistors of an output stage of the module. This has lowered the operating speed and shortened the life of the electronic devices.

The present invention has been accomplished in view of the above mentioned problem, and its object is to provide a power amplifying module that can radiate the heat generated by the transistor to the outside with high efficiency.

The present invention is directed to a power amplifying module comprising:

an insulating substrate having a principal surface on which an electronic conducting pattern is formed and having at least one through hole formed as penetrating between the principal surface and a back surface thereof;

a metal bottom plate on which the insulating substrate is mounted; at least one heat spreader mounted on the bottom plate and exposed through the through hole provided in the insulating substrate;

at least the semiconductor device mounted on a surface of at least one heat spreader and electrically connected to the electrically conducting pattern on the insulating substrate, to form a power amplifying circuit and a package cap for housing the insulating substrate inside and being fit with the bottom plate, wherein each of the bottom plates and at least one heat spreader is made of a material having a thermal conductivity larger than that of a material of the insulating substrate.

When the module operates as a power amplifying module, the heat generated by the semiconductor device is radiated with high efficiency through the heat spreader and the bottom plate to the outside of the package, therefore, the various circuit elements constituting the power amplifying circuit can operate without being exposed to high temperatures.

The height of the heat spreader is nearly equal to a thickness of the insulating substrate. Therefore, the lead pins of the semiconductor device can be readily bonded, by soldering, to the electronic conducting pattern on the insulating substrate.

The material of at least one heat spreader is Cu or CuW, so a heat spreader having the high heat radiation effect is obtained.

The material of the bottom plate is Cu or FeNi alloy, so that heat conducted to the heat spreader 18 is diffused effectively to the outside.

The semiconductor device is preferably a field effect transistor, or the like.

The module further comprises a plurality of lead pins fixed to an edge of the insulating substrate and having a respective leg portion bent to the bottom surface side of the insulating substrate, the bottom plate is provided in contact with the insulating substrate thereto so as not contact said lead pins, a distance of lift of the insulating substrate due to the bending of the leg portions is equal to a thickness of the bottom plate. This can prevent the play when the power amplifying module is mounted on the printed circuit board and it can avoid the undesirable mechanical stress in soldering.

The plurality of lead pins can are fixed to one side end of the insulating substrate.

The plurality of lead pins can also be fixed to both side ends of the insulating substrate.

DESCRIPTION OF THE PREFERRED EMBODIMENT

Figure 1:
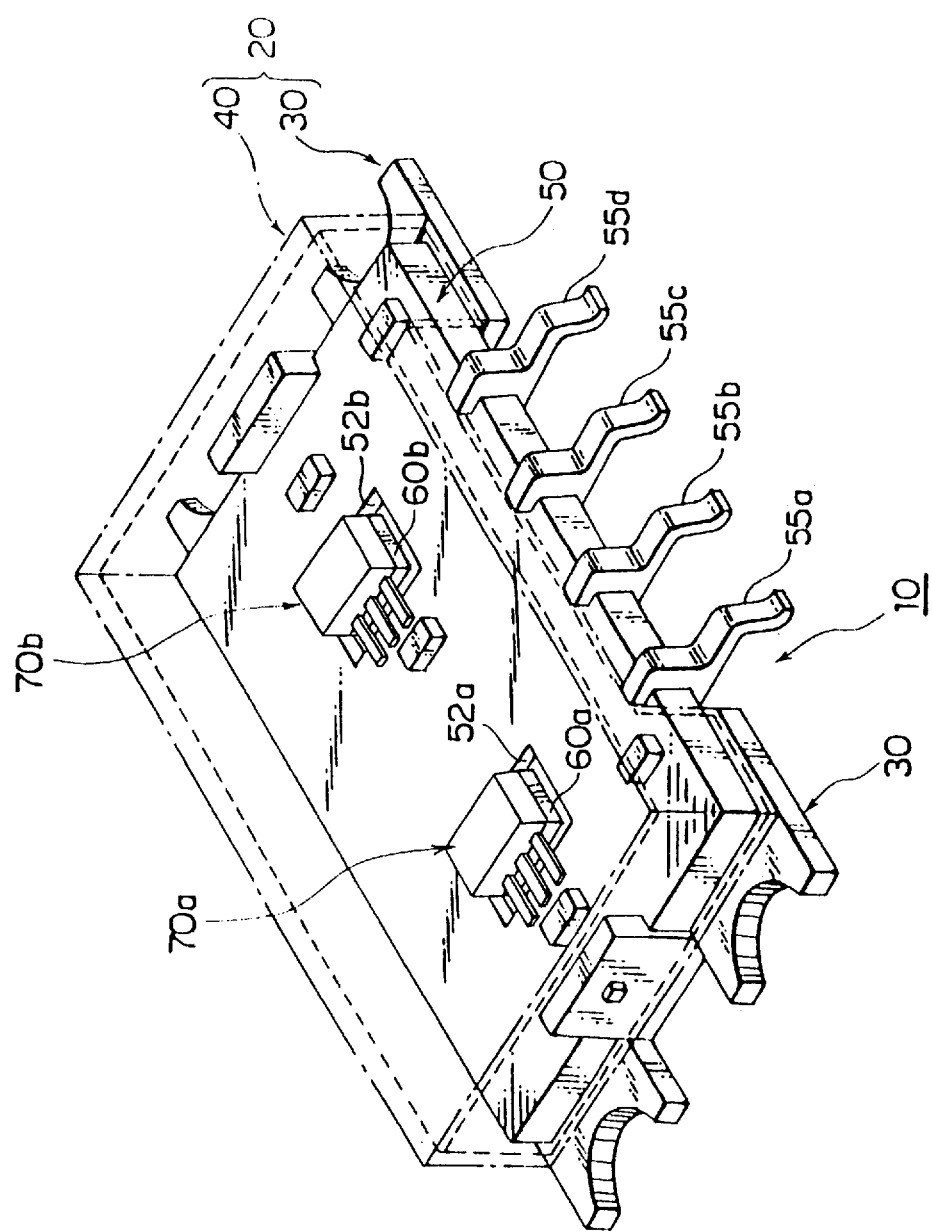
FIG. 1 is a perspective view to show the power amplifying module according to an embodiment of the present invention.

The embodiment of the power amplifying module according to the present invention will be explained with reference to the accompanying drawings. In the drawings, same reference numerals denote same or equivalent portions and redundant description is be omitted.

FIG. 1 is a perspective view of the module according to an embodiment of the present invention.

Figure 2:
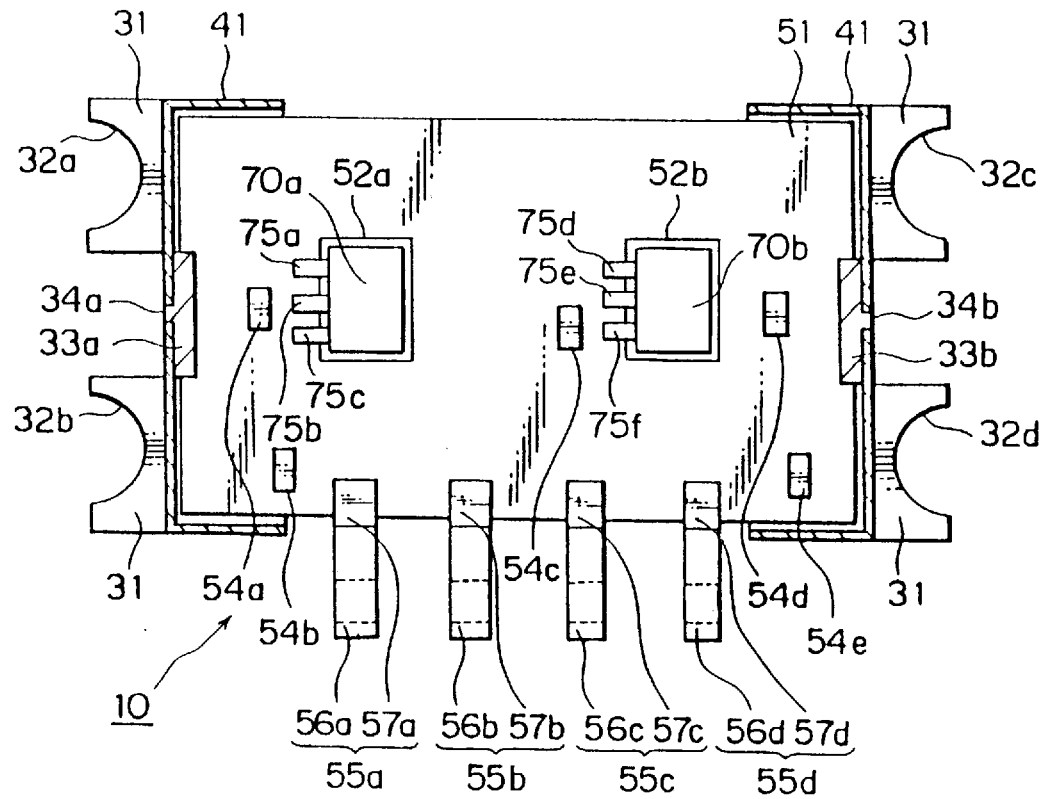
FIG. 2 is a sectional view of the power amplifying module, taken along the X-Y plane crossing through an upper part of the package cap in FIG. 1.
Figure 3:
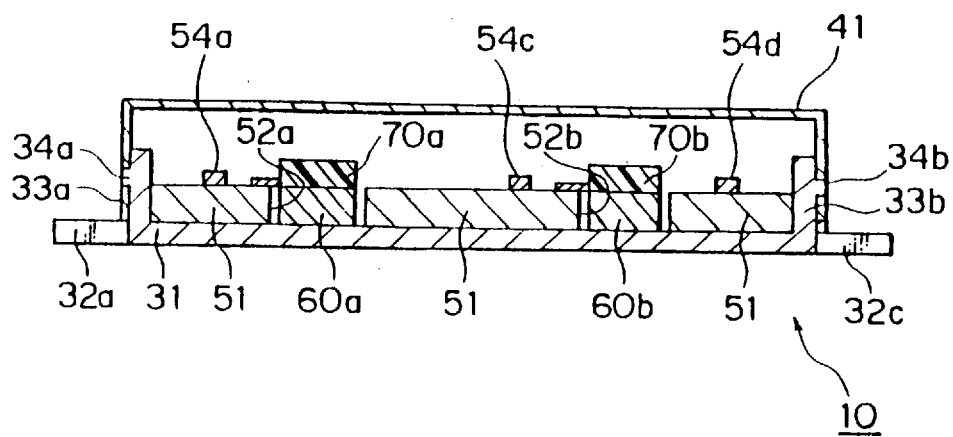
FIG. 3 is a sectional view of the power amplifying module, taken along the Y-Z plane including the center line extending in the longitudinal direction in FIG. 1.
Figure 4:
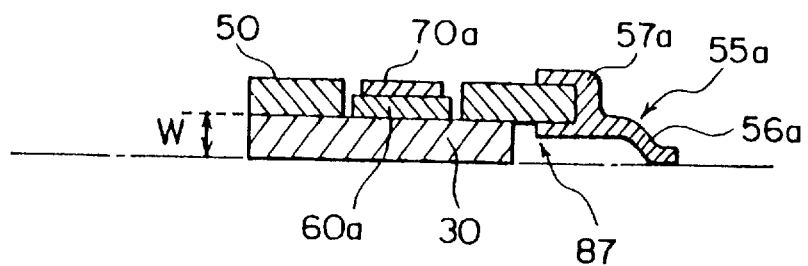
FIG. 4 is a sectional view of the power amplifying module, taken along the X-Z plane in FIG. 1.
Figure 5:
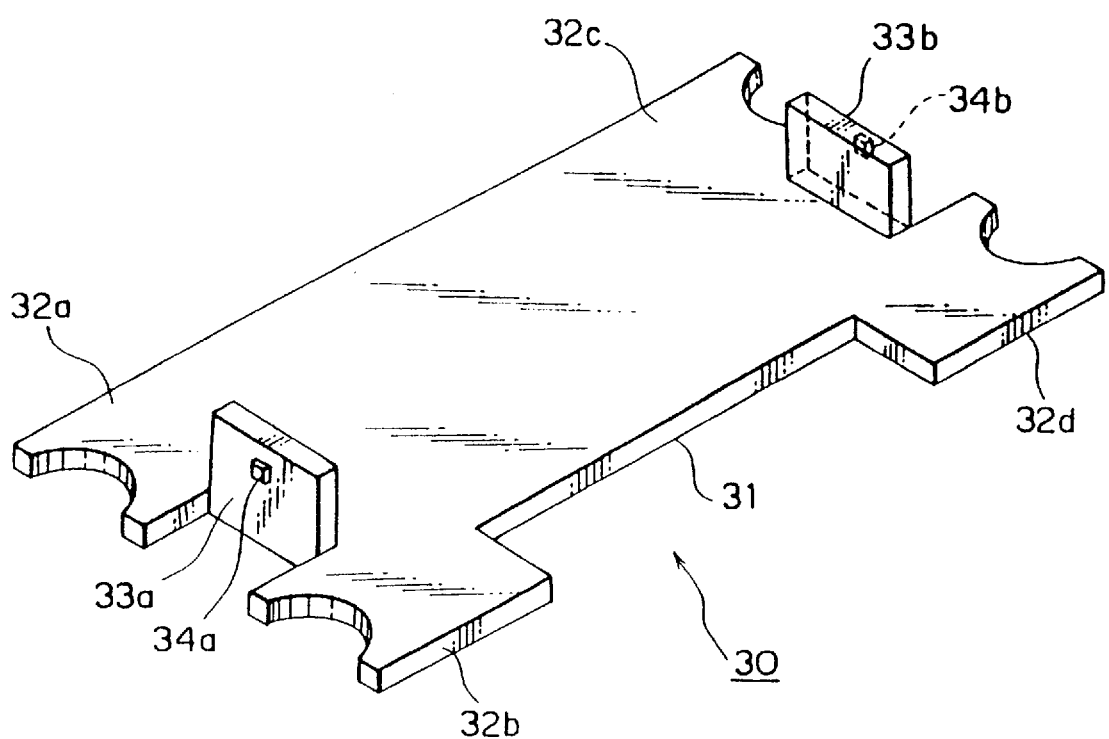
FIG. 5 is a perspective view to show the stem in the power amplifying module of FIG. 1.

FIG. 2 is a sectional view taken along the X-Y plane crossing through the upper part of the package cap in FIG. 1. FIG. 3 is a sectional view taken along the Y-Z plane including a center line extending along the longitudinal direction in FIG. 1. FIG. 4 is a sectional view taken along the X-Z plane.

The module 10 of the present embodiment is provided with a package 20 constructed by welding a package bottom plate 30 to a package cap, the package bottom plate has a substantially plate-like body and the package cap is made of a metal and a nearly rectangular box shape. An insulating substrate 50 is placed onto the package bottom plate body 30 and the insulating substrate is covered by the cap 40. Two through holes 52a and 52b are formed in the insulating substrate 50, and two heat spreaders 60a, 60b with a nearly flat shape are placed onto the package bottom plate body 30 at the portions exposed in the through holes 52a and 52b. Semiconductor devices 70a, 70b in a resin-molded form are fixed on respective surfaces of the heat spreaders 60a, 60b by soldering.

Next, as shown in FIG. 4, the package bottom plate 30 is kept in contact with the bottom surface of the insulating substrate 50 so as not to contact to the fixing portion of lead pins 57a. The bend of the leg portions 56a–56d of the lead pins 55a–55d, which is equivalent of the lift of the insulating substrate, is nearly equal to the thickness W of the package bottom plate 30. Moreover, because of a clearance 87 between each fixing portion 57a–57d of the lead pins 55a–55d and the bottom plate 30, electrical short circuit can be prevented.

The insulating substrate 50 and the package bottom plate 30 are made of the materials having linear expansion coefficients close to each other as shown in the following table.

TABLE

| wiring substrate | package bottom plate |
| --- | --- |
| ceramic composite | Cu or CuZn |
| PPO or glass epoxy resin or Teflon composite | Al |
| $Al_2 O_3$ | CuW or FeNi alloy |

The stem 30 is made of the material having a larger thermal conductivity than that of the insulating substrate. For example, it is made of Cu or FeNi alloy. The stem 30 has a substrate supporting portion 31 and cap supporting portions 32a–32d arranged at the both longitudinal ends of the substrate supporting portion 31.

The transverse edge of cap supporting portions 32b and 32d is cut in a nearly rectangular shape. The longitudinal edge of the four cap supporting portions 32a–32d are cut in a semi-circular shape.

Two substrate pinching portions 33a, 33b are provided between the two cap supporting portions 32a, 32b and between the portions 32c, 32d, respectively. Both portions 33a, 33b are bent in the normal direction and arranged to engage with engaging portions in the insulating substrate 50. Cap fitting projections 34a, 34b are formed in the outside surface of these substrate pinching portions 33a, 33b and are engaged with dents of the cap.

Figure 6:
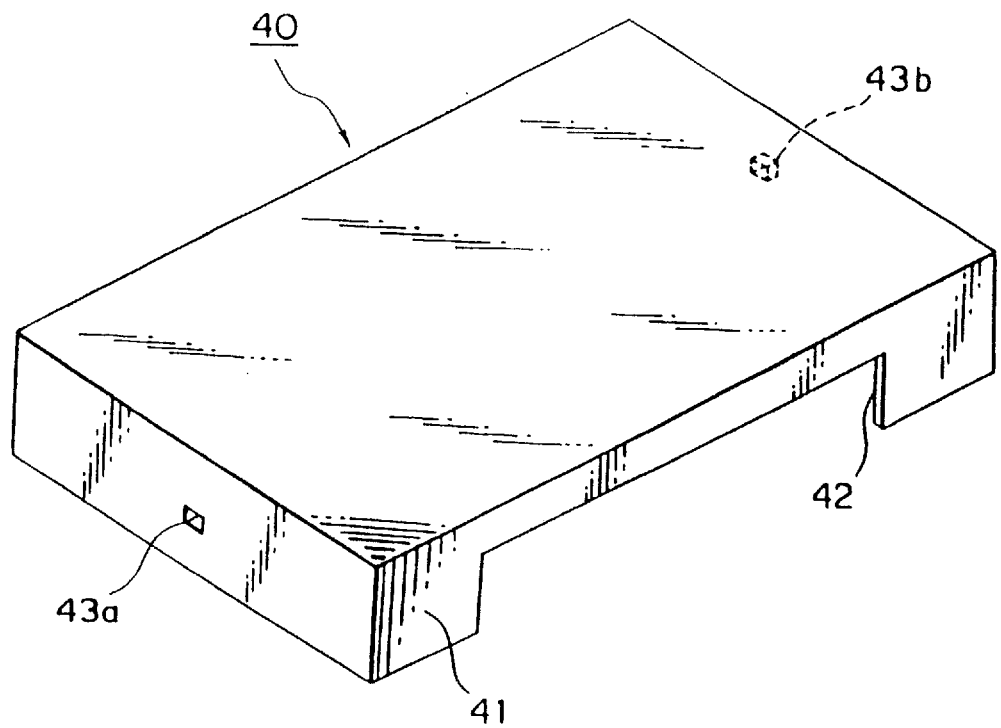
FIG. 6 is a perspective view to show the package cap in the power amplifying module of FIG. 1.

The cap 40, as shown in FIG. 6, has a hollow space and is made of a material such as Cu or FeNi alloy, which has a larger thermal conductivity than that of the insulating substrate 50. The cap 40 has an insulating support portion 41 and a pin passing portion 42 formed by cutting the side plate. The latter portion permits the lead pins 55a–55d to pass through. The cap 40 has two dents 43a, 43b in the side plates provided along a longitudinal direction. They permit the two cap fitting projections 34a, 34b to fit in and to be held.

Figure 7:
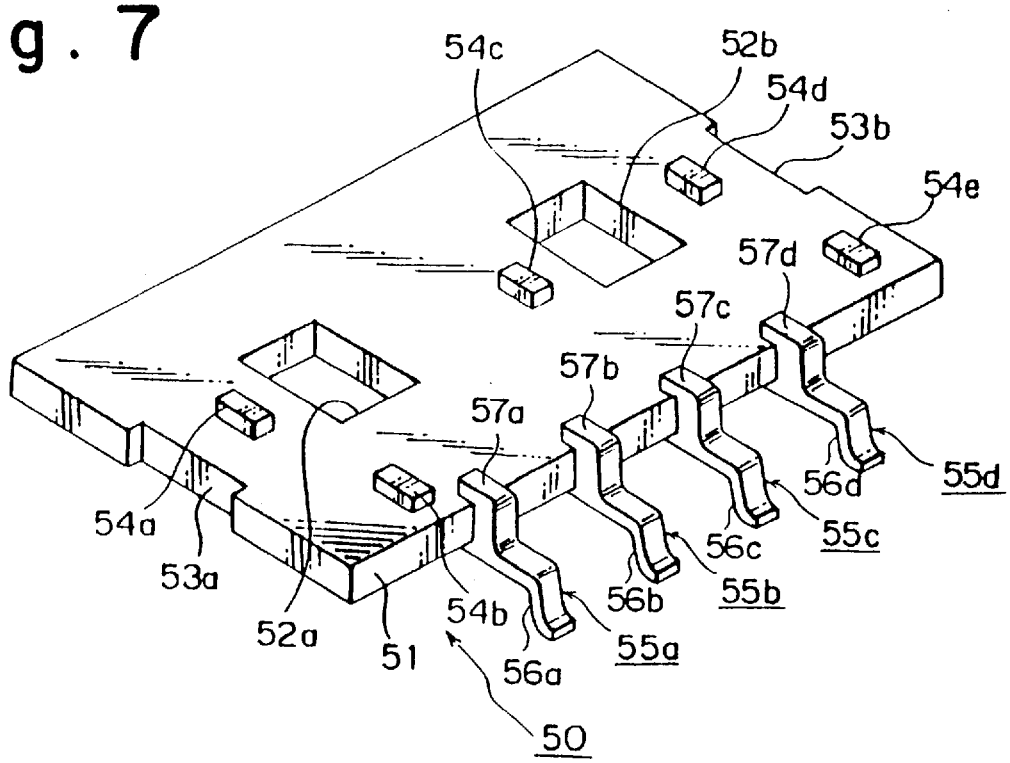
FIG. 7 is a perspective view to show the wiring substrate in the power amplifying module of FIG. 1.

The insulating substrate 50, as shown in FIG. 7, has an electrically insulating body 51 formed in a thin plate shape and various electronic components 54a–54e are set on the top surface of the body 51. The lead pins 55a–55d are provided on the side edge cramping the body and sticking through the pin passing portion 42 of the cap 40. The body 51 is made of an inorganic material such as alumina, glass, or glass fabric/epoxy resin laminate material including a PPO (2,5-dyphenyloxazole) or the like. Two through holes 52a and 52b are formed through the body passing through from a front surface of the body to the back surface of the body. At the longitudinal edge of the body 51, the engaging portions 53a, 53b are provided in a nearly rectangular parallelepiped shape and engaged with the two substrate pinching portions of the stem 30.

The lead pins 55a–55d are metal clip type lead pins fixed with clamping the front and back surface of the body 51, and they are made of, for example, phosphor bronze. These lead pins 55a–55d have hook-shaped cramping portions 57a, 57d for cramping the side edge of the body 51 and the leg portions 56a–56d bent downward. The cramping portions 57a–57d are electrically connected to a predetermined portion of the conducting pattern formed on the body 51. The conducting pattern on the body 51 is a metal thin film made of, for example, Cu.

Figure 8:
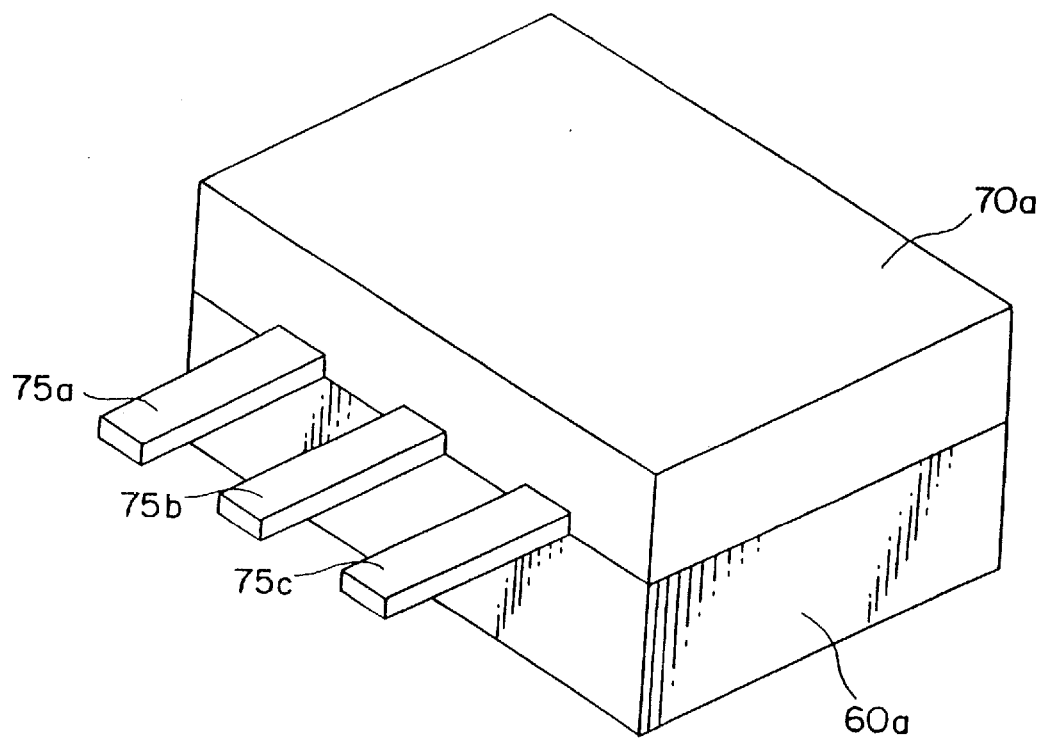
FIG. 8 is a perspective view to show the heat spreader and semiconductor device in the power amplifying module of FIG. 1.

The heat spreaders 60a, 60b are, as shown in FIG. 8, a semiconductor device mount table placed on the package bottom plate at the through hole in the insulating substrate. Heat spreader 60b is constructed substantially in the same manner as the heat spreader 60a. These spreaders 60a and 60b are fixed on the package bottom plate 30 with adhesive means having high heat resistance. The heat spreader 60a and 60b are made of a material such as Cu or CuW having larger thermal conductivity than that of the body 51.

At least one electrode of the semiconductor device 70a is exposed to the entire bottom surface of its package and is electrically connected and mechanically fixed to the heat spreader 60a. The lead pins 75a–75c projecting from the semiconductor device 70a are electrically connected, by soldering, to the conducting pattern on the body 51. The semiconductor device 70b is also constructed substantially in the same manner as the semiconductor device 70a and fixed on a surface of the heat spreader 60b.

The thickness of the heat spreader 60a is preferable to be nearly equal to the thickness of the body 51. This enables contact between the lead pins 75a–75c and the conducting pattern of the body 51 with good electrically characteristics.

Next explained is the operation of the module 10 in the present embodiment.

The semiconductor devices 70a and 70b are connected to the conducting pattern of the body 51 through the lead pins 75a–75c and constitute the power amplifying circuit together with the electronic components 54a–54e. In such a power amplifying circuit, the semiconductor device 70a, 70b generate a lot of heat when these are used as an output stage.

The stem 30, cap 40 and the two heat spreaders 60a, 60b in the package 20 are made of the material with larger thermal conductivity than that of the body 51. Therefore, the heat generated by the semiconductor devices 70a, 70b can be radiated to the outside of the package through the heat spreaders, the bottom plate and the cap with high efficiency.

Therefore, the electronic components 54a–54e are not affected by the heat generated by the semiconductor devices 70a and 70b. Thus, passive elements can operate stably without being exposed to high temperature and the bad effects thereof.

Next explained is measurement of heat radiation characteristics with an experimental example of the power amplifying module 10 in the present embodiment.

The power amplifying module of the present experimental example was produced based on the following specifications.

Body
   material PPO,
   thickness 0.6 mm,
   coefficient of linear expansion 20 ppm/K,
   relative dielectric constant 10.4

Heat Spreaders
   material Cu,
   thickness 0.6 mm,
   thermal conductivity 3.9 W/cm K,
   coefficient of linear expansion 17 ppm/K, Package Bottom Plate
   material Cu,
   thickness 0.6 mm,
   thermal conductivity 3.9 W/cm K,
   coefficient of linear expansion 17 ppm/K The thermal resistance of the power amplifying module of the present experimental example made in this manner was repetitively measured several times, and measurement results were as follows.

Measured values of thermal resistance: 14.7–16.6 K/W

The thermal resistance θ [K/W] of power amplifying module is defined by the following equation.

$$\theta = \Delta T / Q$$

where $\Delta T$ is a difference between the channel temperature of the semiconductor device and the ambient temperature of package, and Q is the power consumption [W] of the power amplifying module.

In the case of the FET for the semiconductor device, it is required to maintain the channel temperature below 130° C. for the ordinal operation. On the other hand the ambient temperature of 80° C. maximum is demanded for the use of electronic devices. Therefore, the temperature difference between the channel of FET and the ambient must keep below 50° C. under any power consumption of the module.

Figure 9:
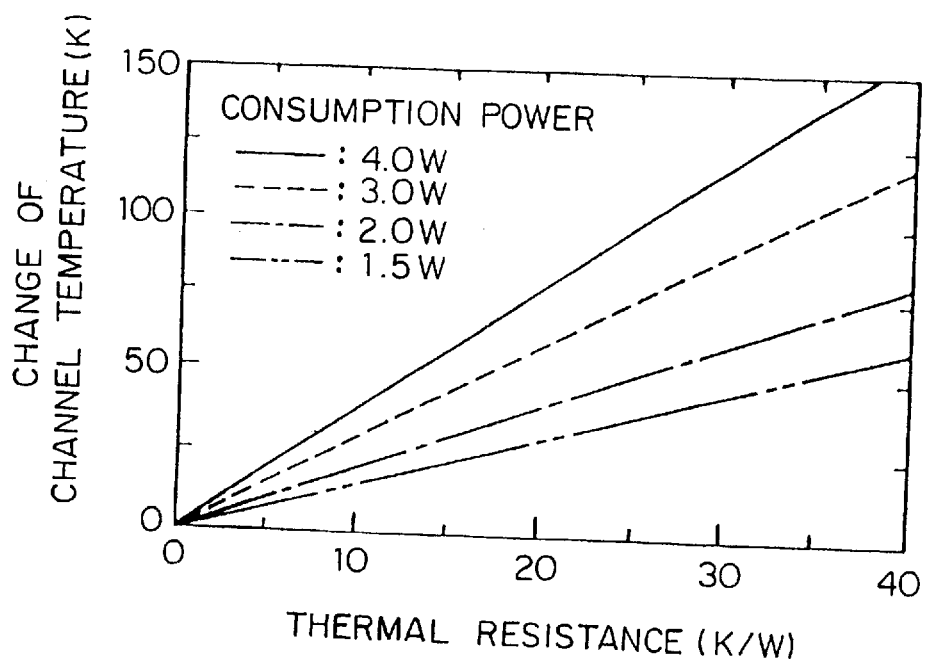
FIG. 9 is a diagram to show characteristics of thermal resistance versus change of channel temperature for various consumption powers in order to evaluate the thermal resistance of an experimental example in the power amplifying module according to the present invention.
Figure 10A:
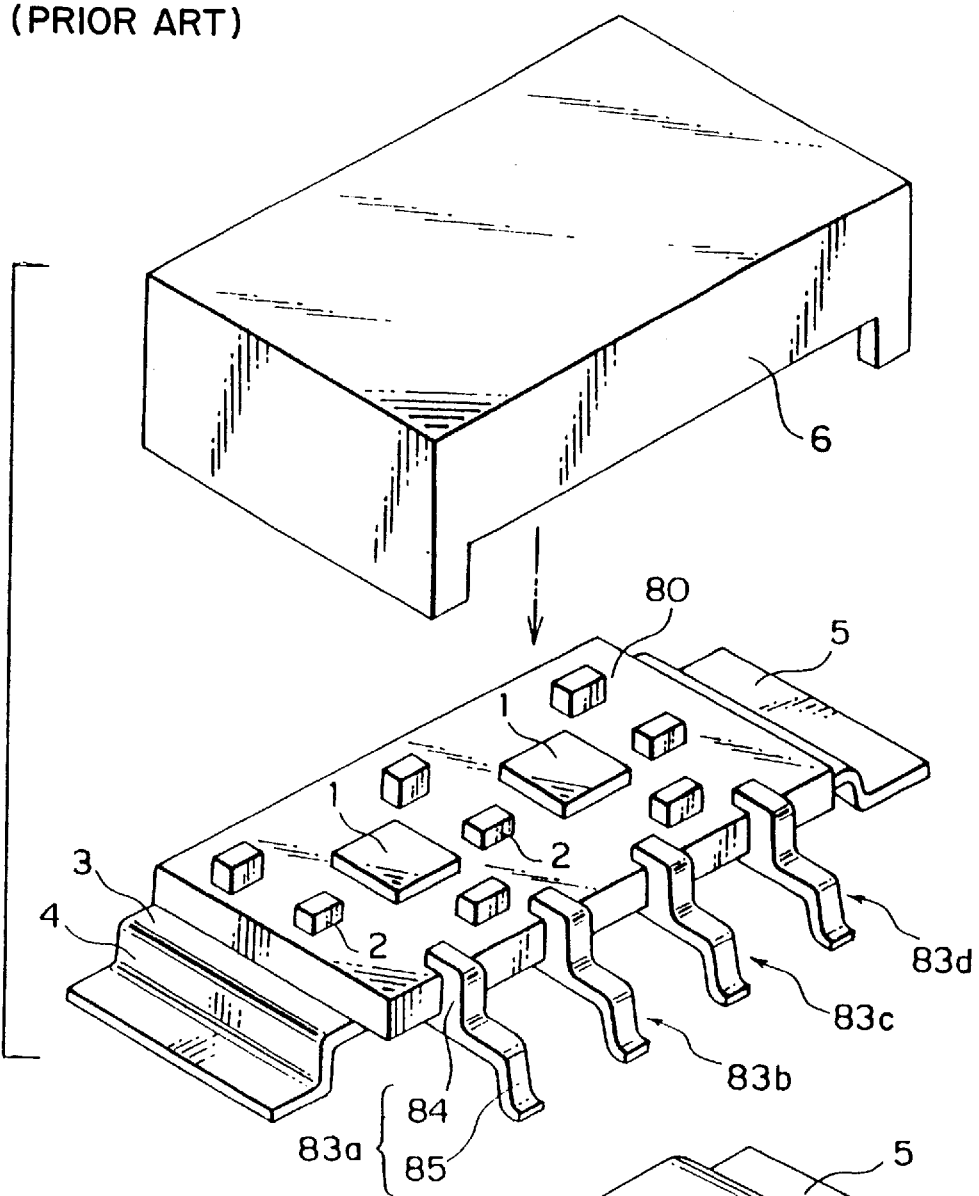
FIGS. 10A and 10B are perspective views to show the conventional module electronic component.
Figure 10B:
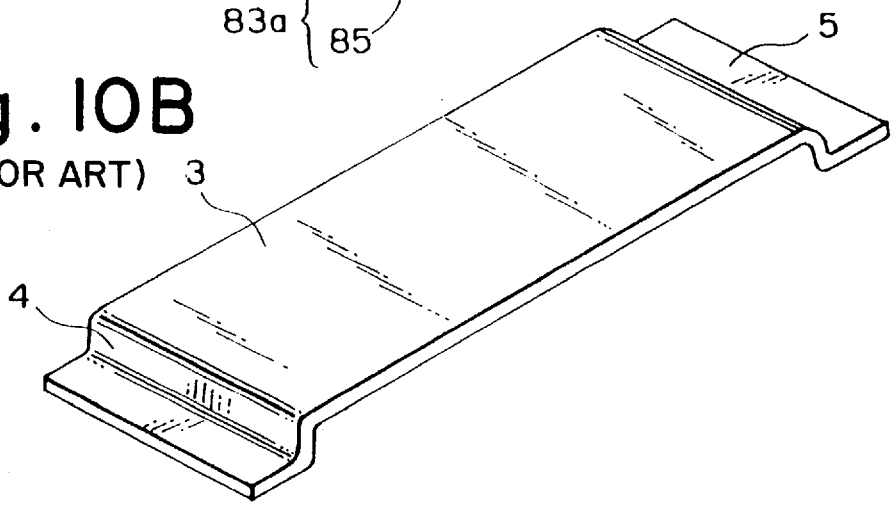

It is apparent from FIG. 9 that in the heat radiation in the power amplifying module of the present experimental example, the power consumption of 3 W or less is allowed to keep the temperature difference between the channel of FET and the ambienet below 50° C. It is noted that the present invention is not limited to the embodiment above mentioned, but may have various modifications. For example, in the above-stated embodiments, Cu or CuW is employed as the material of the heat spreader and Cu or FeNi alloy is employed as the material of the package. But any metals, alloys or else may be employed as the materials for forming the heat spreaders and package as far as they have larger thermal conductivity than that of the insulating substrate.

Although the present embodiment utilizes FETs for the semiconductor device, any electric devices may be applied as far as they can operate as a power amplifier by electrically connecting to an electronic circuit conducting pattern on the insulating substrate.

Although the two through holes are formed in the present invention, only one or many through holes may be formed at arbitrary positions on the insulating substrate. This permits the heat spreader and semiconductor device to be successively positioned on the surface of the package bottom plate exposed through each through hole.

The present embodiment is the so-called single in-line type module in which the lead pins are formed on one side of the insulating substrate. But, the present invention can also be applied to the dual in-line type module in which the lead pins are formed on the both sides of the insulating substrate.

Further, the present invention is by no means limited to the power amplifying modules, but may also be applied to various electronic components in a wide area.

As explained above, according to the present invention, when the power amplifying modules are operated as a Power Amplifier, the heat generated by the semiconductor devices is transferred to the heat spreader and the package without almost transferring to the insulating substrate. Therefore, the heat is transferred to the outside of the package with high efficiency through the heat spreaders and the bottom plate. This gives the advantage that the various electronic devices constituting the power amplifying circuit can operate without being exposed to high temperature. When the present power amplifying module is placed onto the substrate, such as the printed circuit board, the bottom plate, the package bottom plate having the thickness which is equal to the bend of the lead pins, is inserted between the insulating substrate and the board and adhered closely. As the result, the insulating substrate can be arranged stably. This can solve the conventional problem, for example, the deterioration of the electronic characteristics due to the mechanical stress and the incompleteness of the heat transfer between the bottom plate and the board.

What is claimed is:

1. A power amplifying module comprising:
   a wiring substrate having a through hole is formed therein so as to penetrate between a principal surface and a back surface thereof,
   an electronic circuit pattern formed on the principal surface of the substrate;
   a metal package substrate on which said wiring substrate is mounted, said metal package substrate having a two substantially flat surfaces opposite to each other through said metal package substrate;
   a heat spreader mounted on one of said flat surfaces of said metal package substrate and exposed through the through hole provided in said wiring substrate, said heat spreader being made of a material having a thermal conductivity that is larger than that of the material of said wiring substrate;
   a semiconductor device in molded form fixed on a top surface of said heat spreader and having a terminal extending from a side surface of said semiconductor device in a direction parallel with a bottom surface of said semiconductor device and connected to a part of said electronic circuit pattern;
   a plurality of leads pins fixed to an end of said wiring substrate, each extending from the end of the wiring substrate downward, and the lowest portions of said lead pins being substantially on the same plane as the other flat surface of said metal package each of said metal package substrate; and
   a package cap for housing said wiring substrate inside and fixed to said metal package substrate, wherein said metal package substrate is bonded on said wiring substrate without contacting said plurality of lead pins.

2. A power amplifying module according to claim 1, wherein the heat spreader has a thickness that is substantially equal to that of said wiring substrate.

3. A power amplifying module according to claim 1, wherein said heat spreader is made of Cu.

4. A power amplifying module according to claim 1, wherein said heat spreader is made of CuW.

5. A power amplifying module according to claim 1, wherein said metal package substrate is made of Cu.

6. A power amplifying module according to claim 1, wherein said metal package substrate is made of FeNi alloy.

* * * * *